United States Patent
Fujimoto et al.

(10) Patent No.: US 7,561,609 B2
(45) Date of Patent: Jul. 14, 2009

(54) SEMICONDUCTOR LASER DEVICE AND METHOD OF FABRICATING THE SAME

(75) Inventors: Yasuhiro Fujimoto, Okayama (JP); Toru Takayama, Nara (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 11/907,016

(22) Filed: Oct. 9, 2007

(65) Prior Publication Data
US 2008/0198887 A1    Aug. 21, 2008

(30) Foreign Application Priority Data
Feb. 21, 2007   (JP) ............... 2007-040755

(51) Int. Cl.
*H01S 5/00* (2006.01)
(52) U.S. Cl. ............... 372/50.12; 372/50.121
(58) Field of Classification Search ........... 372/43.01, 372/46.015, 49.01, 50.1, 50.12, 50.121, 45.011
See application file for complete search history.

(56) References Cited

U.S. PATENT DOCUMENTS 5,144,633 A * 9/1992 Ohnaka et al. .......... 372/45.01
2008/0080580 A1 * 4/2008 Takayama et al. ...... 372/45.011

FOREIGN PATENT DOCUMENTS

JP    11-186651    7/1999

* cited by examiner

*Primary Examiner*—Armando Rodriguez
(74) *Attorney, Agent, or Firm*—McDermott Will & Emery LLP (57) ABSTRACT

A semiconductor laser device includes a first cavity and a second cavity formed apart from each other over a semiconductor substrate. The first cavity includes a first buffer layer and a first semiconductor layer including a first active layer, and the second cavity includes a second buffer layer and a second semiconductor layer including a second active layer. A window structure is provided in a region near an end face of each of the first semiconductor layer and the second semiconductor layer. A band gap of the first buffer layer is greater than that of the first active layer, and a band gap of the second buffer layer is greater than that of the second active layer.

7 Claims, 4 Drawing Sheets

SEMICONDUCTOR LASER DEVICE AND METHOD OF FABRICATING THE SAME

CROSS-REFERENCE TO RELATED APPLICATION(S)

This application claims priority under 35 U.S.C. §119(a) on Japanese Patent Application No. 2007-040755 filed on Feb. 21, 2007, the entire contents of claims, specification, and drawings of which are incorporated herein by reference.

BACKGROUND OF THE INVENTION

1. Field of the Invention

The present invention relates to a semiconductor laser device including a plurality of cavities and to a method of fabricating the same. Specifically, the present invention relates to a multiwavelength semiconductor laser device used as a light source typically for an optical disc device or for other devices such as an electronic device and an information processor and to a method of fabricating the same.

2. Description of the Prior Art

Currently, an optical information-storage medium is widely available as a storage medium for storing digital information for example. However, various standards are established for the optical information-storage medium, and light sources differing in wavelength are required depending on types of optical information-storage media. For example, a compact disc (CD) requires a light source having a wavelength of 780 nm in an infrared range, and a digital versatile disc (DVD) requires a light source having a red wavelength of 650 nm. Therefore, a multiwavelength semiconductor laser device for outputting a laser beam with a plurality of wavelengths is a subject of interest.

Meanwhile, in order to improve storing speed of the optical information-storage medium, increasing in power of the semiconductor laser devise is promoted. Especially, it is desired to increase the power of a semiconductor red-laser device used for a DVD device to read and write information on a DVD. One of main factors restricting the increasing in power of the semiconductor red-laser device is degradation in a cavity end face of the semiconductor laser device. The degradation is referred to as COD (Catastrophic Optical Damage) degradation and results from optical absorption caused by defects near the cavity end face. That is, when the semiconductor laser device is in a high power operation, surface recombination at an output end face and an increase in light absorption near the end face raise the temperature of the output end face, resulting in destruction of the end face.

In order to prevent the COD degradation, Japanese Laid-Open Patent Publication No. 11-186651 for example discloses to diffuse an impurity such as zinc (Zn) in an area of an active layer near a laser output end face for forming a window structure. Since the diffusion of the impurity causes intermixing in the area of the active layer near the end face, a band gap of the active layer increases near the end face. This makes it possible to keep a state substantially transparent to a laser oscillation light, even in the case where heat generation decreases the band gap of the active layer near the end face. Therefore, it is possible to suppress the COD degradation.

However, applying the conventional method of preventing the COD degradation to the multiwavelength semiconductor laser device has problems as follows. An active layer of the semiconductor red-laser device includes an aluminum gallium indium phosphorus (AlGaInP)-based material. On the other hand, an active layer of a semiconductor infrared-laser device includes an aluminum gallium arsenic (AlGaAs)-based material. The diffusion velocity of an impurity such as Zn is higher in the AlGaInP-based material than in the AlGaAs-based material. Therefore, if a diffusion condition of the impurity for forming the window structure is optimized for the semiconductor infrared-laser device, Zn diffuses into an n-type cladding layer below the active layer of the semiconductor red-laser device. Since Zn serves as a p-type impurity in a III-V group compound semiconductor, the n-type cladding layer becomes p-type, and a pn junction is eventually formed between the cladding layer and a buffer layer near an n-type substrate.

If the pn junction is formed between the cladding layer and the buffer layer, a band gap of the buffer layer which is smaller than that of the active layer may cause a turn-on in the pn junction between the n-type buffer layer and the previously intermixed window area. This lowers a forward transient build-up voltage, resulting in a cause of a leak current. Moreover, due to the turn-on, a current is no longer input in a non-intermixed active layer. As a result, light emitting efficiency decreases, a reactive current increases an operating current value, and a temperature characteristic deteriorates. Therefore, it is not possible to obtain a high power characteristic of several hundreds mW or more, and the problem arises that the reliability of the device greatly decreases.

SUMMARY OF THE INVENTION

In view of the conventional problems above, an object of the present invention is to allow realizing a semiconductor laser device including a plurality of cavities, wherein a leak current is not caused by impurity diffusion and reliability does not decrease in high power operation.

In order to achieve the object, the semiconductor laser device of the present invention includes a plurality of cavities each of which has a buffer layer whose band gap is greater than that of an active layer.

Specifically, the semiconductor laser device of the present invention includes a first cavity and a second cavity formed apart from each other over a semiconductor substrate, wherein the first cavity includes a first buffer layer and a first semiconductor layer on the first buffer layer, the first semiconductor layer including a first lower cladding layer, a first active layer, and a first upper cladding layer, and the first semiconductor layer being formed with a stripe structure, the second cavity includes a second buffer layer and a second semiconductor layer on the second buffer layer, the second semiconductor layer including a second lower cladding layer, a second active layer, and a second upper cladding layer, and the second semiconductor layer being formed with a stripe structure, a window structure is provided in a region near an end face of each of the first semiconductor layer and the second semiconductor layer, the window structure being formed by diffusing an impurity, a band gap of the first buffer layer is greater than that of the first active layer, and a band gap of the second buffer layer is greater than that of the second active layer.

According to the semiconductor laser device of the present invention, a transient build-up voltage of a pn junction formed in an interface between the lower cladding layer and the buffer layer in the window structure is greater than a transient build-up voltage of the active layer. Therefore, an increase in leak current due to a decrease in forward transient build-up voltage is suppressed. Moreover, since a reduction in light emitting efficiency is also suppressed, it is possible to realize a semiconductor laser device having high reliability also in high power operation.

A method of fabricating the semiconductor laser device of the present invention is directed to a method of fabricating a semiconductor laser device including a first cavity and a second cavity formed apart from each other over a semiconductor substrate, the method including the steps of: (a) over the semiconductor substrate, forming a first semiconductor layer through a first buffer layer and forming a second semiconductor layer through a second buffer layer, the first semiconductor layer including a first active layer, and the second semiconductor layer including a second active layer and being apart from the first semiconductor layer; and (b) over the first semiconductor layer and the second semiconductor layer near areas where cleavage faces are to be formed, forming impurity material layers for diffusing an impurity, and then performing a thermal treatment for selectively diffusing the impurity in the first semiconductor layer and the second semiconductor layer, wherein a band gap of the first buffer layer is greater than that of the first active layer, and a band gap of the second buffer layer is greater than that of the second active layer.

According to the method of fabricating the semiconductor laser device of the present invention, a window structure of the first cavity and a window structure of the second cavity are formed in one step. Therefore, it is possible to reduce cost of fabricating a semiconductor laser device. Moreover, since the band gap of the first buffer layer is greater than that of the first active layer and the band gap of the second buffer layer is greater than that of the second active layer, an increase in leak current due to a decrease in forward transient build-up voltage is suppressed. Moreover, since a reduction in light emitting efficiency is also suppressed, it is possible to realize a semiconductor laser device having high reliability also in high power operation.

BRIEF DESCRIPTION OF THE DRAWINGS

FIG. 3A and FIG. 3B are graphs illustrating the relationship between the composition of a III-V group compound and the band gap, wherein FIG. 3A shows an AlGaInAs-based material, and FIG. 3B shows an AlGaInP-based material.

DESCRIPTION OF THE PREFERRED EMBODIMENTS

Figure 1:
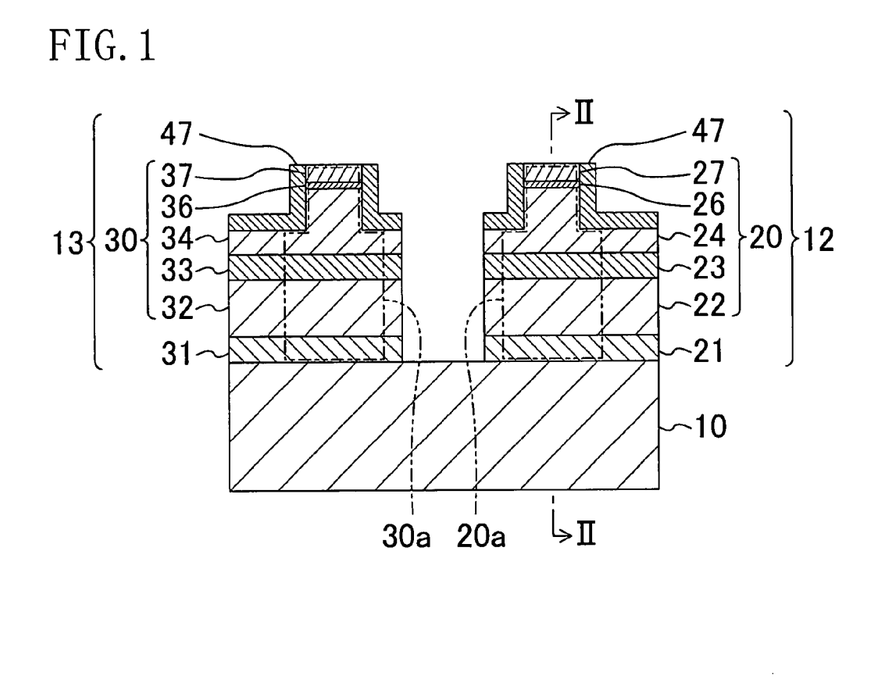
FIG. 1 is a cross sectional view illustrating a semiconductor laser device of an embodiment of the present invention.

An embodiment of the present invention will be described with reference to the drawings. FIG. 1 shows a configuration of a cavity end face (output end face) of a semiconductor laser device of an embodiment. As shown in FIG. 1, the semiconductor laser device of the present embodiment includes a substrate 10 formed of n-type GaAs, on which a first cavity 12 for outputting a red laser beam and a second cavity 13 for outputting an infrared beam are formed.

The configuration of the first cavity 12 is as follows. Over the substrate 10, a first semiconductor layer 20 is formed through a first buffer layer 21. The first buffer layer 21 is provided by n-type AlGaInAs layers and n-type AlGaInP layers which are alternately stacked.

The first semiconductor layer 20 includes, in order from bottom to top, a first lower cladding layer 22, a first active layer 23, a first upper cladding layer 24, a first protection layer 26, and a first contact layer 27.

The first lower cladding layer 22 is formed of n-type AlGaInP having a thickness of 2 μm. The first active layer 23 has a strained quantum well structure wherein first well layers of GaInP and first barrier layers of AlGaInP are alternately stacked between a first lower guide layer of AlGaInP and a first upper guide layer of AlGaInP. The first upper cladding layer 24 has a ridge stripe section and is formed of p-type AlGaInP. The first protection layer 26 is formed of p-type GaInP having a thickness of 50 nm and is formed on the ridge stripe section of the first upper cladding layer 24. The first contact layer is formed of p-type GaAs having a thickness of 400 nm.

The first upper cladding layer 24 has a thickness of 1.4 μm in the ridge stripe section and a thickness (dp) of 0.2 μm in a section excepting the ridge stripe section. Regions excepting an upper surface of the ridge stripe section of the first upper cladding layer 24 are covered with current block layers 47 of n-type AlInP having a thickness of 700 nm.

In a region of the first semiconductor layer 20 near the cavity end face, a window structure 20a is formed. The window structure 20a is an intermixed region by diffusion of zinc (Zn).

The configuration of the second cavity 13 is as follows. Over a region of the substrate 10 different from the region where the first cavity 12 is formed, a second semiconductor layer 30 is formed through a second buffer layer 31. The second buffer layer 31 is provided by n-type AlGaInAs layers and n-type AlGaInP layers which are alternately and repeatedly stacked.

The second semiconductor layer 30 includes, in order from bottom to top, a second lower cladding layer 32, a second active layer 33, a second upper cladding layer 34, a second protection layer 36, and a second contact layer 37.

The second lower cladding layer 32 is formed of n-type AlGaInP having a thickness of 2 μm. The second active layer 33 has a quantum well structure wherein well layers of GaAs and barrier layers of AlGaAs are alternately and repeatedly stacked between a second lower guide layer of AlGaAs and a second upper guide layer of AlGaAs. The second upper cladding layer 34 has a ridge stripe section and is formed of p-type AlGaInP. The second protection layer 36 is formed of p-type GaInP having a thickness of 50 nm and is formed on the ridge stripe section of the second upper cladding layer 34. The second contact layer 37 is formed of p-type GaAs having a thickness of 400 nm.

The second upper cladding layer 34 has a thickness of 1.4 μm in the ridge stripe section and a thickness (dp) of 0.24 μm in a section excepting the ridge stripe section. Regions excepting an upper surface of the ridge stripe section of the second upper cladding layer 34 are covered with current block layers 47 of n-type AlInP having a thickness of 700 nm.

In a region of the second semiconductor layer 30 near a second cavity end face, a window structure 30a is formed. The window structure 30a is an intermixed region by diffusion of zinc (Zn).

In the first cavity 12, a current injected from the first contact layer 27 is constricted only in the ridge stripe section by the current block layers 47 and injected concentratedly in a region of the first active layer 23 below the ridge stripe section. As a result, a population inversion state of carriers required for laser oscillation is realized by a low injection current of several tens of milliamperes. Light emitted by recombination of carriers injected in the first active layer 23 includes light in a direction vertical to the first active layer 23 and light in a direction horizontal to the first active layer 23. The light in the direction vertical to the first active layer 23 is confined by the first lower cladding layer 22 and the first upper cladding layer 24. The light in the direction horizontal to the first active layer 23 is confined by the current block layers 47 formed of AlInP whose refractive index is lower than that of the cladding layers.

Since the current block layers 47 are transparent to laser oscillation light, it is possible to realize a low-loss waveguide. Since light transmitted through the waveguide can greatly penetrate to the current block layers 47, it is possible to easily obtain a refractive index difference ($\Delta n$) of an order of $10^{-3}$ which is suitable to high power operation, and to accurately control the size of the $\Delta n$ by the order of $10^{-3}$ by changing the dp.

As in the first cavity 12, also in the second cavity 13, it is possible to easily obtain $\Delta n$ of an order of $10^{-3}$ which is suitable to high power operation, and to accurately control the size of the $\Delta n$ by the order of $10^{-3}$ by changing the size of the dp. In this way, it is possible to realize a high power semiconductor laser device which outputs laser beams of two different wavelengths and which is operated with a low operation current allowing an accurate control of light distribution.

In the semiconductor laser device of the present embodiment, each of the first cavity 12 and the second cavity 13 has a cavity length of 1750 μm. This makes it possible to ensure a sufficient heat dissipation characteristic even in a case where an operation is performed at a high temperature of 80° C. To provide a high power laser device of greater than or equal to 350 mW, it is preferable that the cavity length is longer than or equal to 1500 μm.

In the semiconductor laser device of the present embodiment, each of the first buffer layer 21 and the second buffer layer 31 is formed by alternately stacked AlGaInAs layers and AlGaInP layers. The AlGaInAs layers are made of a III-V group compound including arsenic as a V group element. The AlGaInP layers are made of a III-V group compound including phosphorus as a V group element. The stacking order of the AlGaInAs layers and the AlGaInP layers is preferably, but not especially limited to, such that a layer closest to the substrate 10 is one of the AlGaInAs layers and an uppermost layer is one of the AlGaInP layers.

In this way, in the first buffer layer 21 and the second buffer layer 31, portions lying in contact with the substrate 10 formed of GaAs include As as a V group element which is the same element as that included in the substrate. Moreover, portions lying in contact with the first lower cladding layer 22 and the second lower cladding layer 32 formed of AlGaInP include P as a V group element which is the same element as that included in the lower cladding layers. Therefore, it is possible to reduce roughness on a growth interface and to lower an interface impurity level. Moreover, in the two types of layers included in the first buffer layer 21 and the second buffer layer 31, III group elements serving as a nucleus of growth are Al, Ga, and In. Therefore, alternate growth can be easily realized only by changing the V group element during the growth of the semiconductor layer. The top layers of the first buffer layer 21 and the second buffer layer 31 are formed of AlGaInP which is the same material as that of the first lower cladding layer 22 and the second lower cladding layer 32 which are to be formed in a subsequent growth step. Therefore, there is an advantage that a crystal growth process can be smoothly performed.

Figure 2:
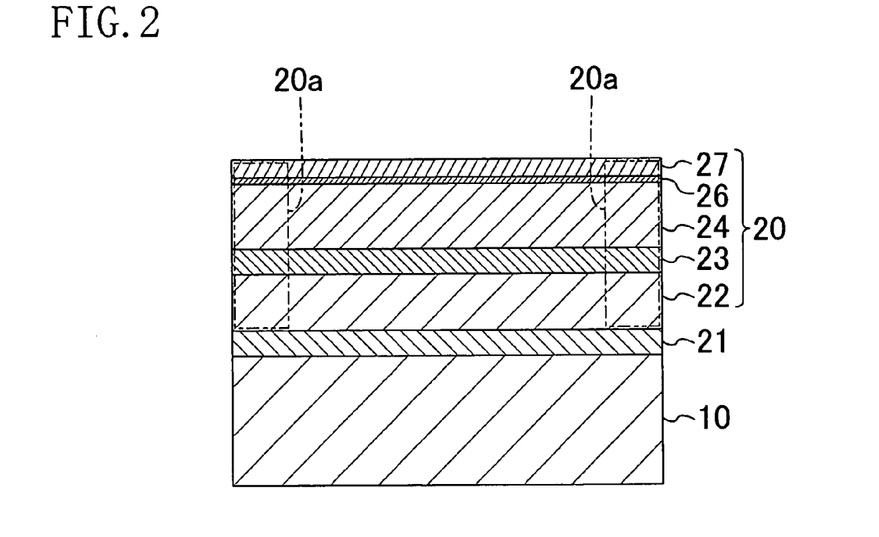
FIG. 2 is a cross sectional view illustrating the semiconductor laser device of the embodiment of the present invention taken along the line II-II of FIG. 1.

Next, the size of band gaps of the first buffer layer 21 and the second buffer layer 31 is concerned. FIG. 2 shows a cross section taken along the line II-II of FIG. 1. That is, FIG. 2 shows a cross section of the first cavity 12 in a cavity direction.

As shown in FIG. 2, when the first buffer layer 21 formed of the AlGaInAs layers and the AlGaInP layers is used, the diffusion of Zn for forming the window structure 20a usually stops near an interface between the first buffer layer 21 and the first lower cladding layer 22. The reason for this is as follows. Zn diffuses quickly in an AlGaInP-based material but slowly in an AlGaInAs-based material. Therefore, even if the diffusion period is extended or the diffusion velocity is increased by raising a process temperature for Zn diffusion, the diffusion velocity of Zn relatively slowed down by the AlGaInAs layers after the diffusion of Zn arrived at the buffer layer formed of the AlGaInAs layers and the AlGaInP layers. The diffusion of Zn in the depth direction eventually stops near the interface between the buffer layer and the cladding layer. The second cavity 13 has substantially the same cross sectional structure in the cavity direction as that of the first cavity 12, although the drawing thereof is omitted. The diffusion of Zn stops near an interface between the second buffer layer 31 and the second lower cladding layer 32.

The lower cladding layer in the window structure becomes p type due to the impurity diffusion. Therefore, a pn junction is formed in an interface between the n-type buffer layer and the lower cladding layer. Meanwhile, the diffusion of Zn for forming the window structure increases the impurity concentration in the window structure to higher than or equal to about $1\times10^{18}$ cm$^{-3}$. Therefore, a transient build-up voltage of the pn junction in the window structure greatly depends on a band gap of the buffer layer. If the transient build-up voltage of the pn junction in the window structure is lower than that of a pn junction in a gain region excepting the window structure, a current injected from an electrode passes through the window structure having the lower transient build-up voltage. If such a condition occurs, a leak current is produced, resulting in lowered light emitting efficiency. As a result, values of an oscillation threshold current and an operation current increase.

In the semiconductor laser device of the present embodiment, the semiconductor laser element in a window area was removal by cleaving to produce a laser diode (LD) bar formed of only the gain region, and then a transient build-up voltage of the pn junction in an active layer section excepting the window structure was measured by valuation. The result was that transient build-up voltages of pn junctions in active layer sections in the first cavity emitting a red laser beam and the second cavity emitting an infrared laser beam excepting window structures were respectively 1.7 V and 1.45 V. This shows that the transient build-up voltages of the pn junctions in the active layer sections excepting the window structures substantially depend on band gaps of the active layers.

Figure 3A:
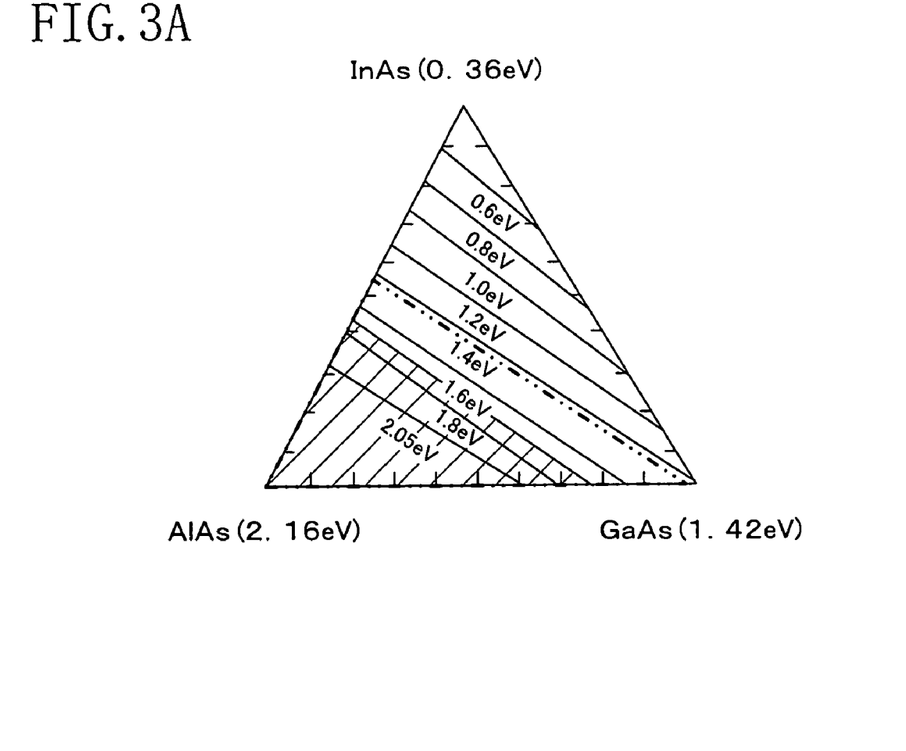
Figure 3B:
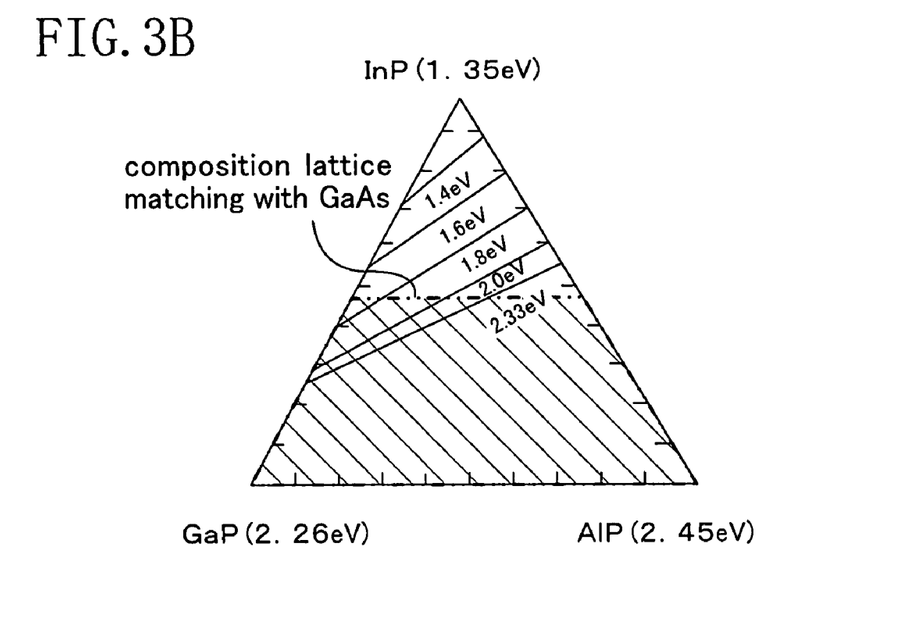

FIG. 3A and FIG. 3B show the relationship between the band gap and the compositions of the AlGaInAs-based material and the AlGaInP-based material, wherein FIG. 3A shows the AlGaInAs-based material and FIG. 3B shows the AlGaInP-based material.

As shown in FIG. 3, the AlGaInAs-based material has a band gap in the range of 0.36 eV to 2.16 eV. The AlGaInAs-based material is greater in lattice constant than GaAs forming the substrate and has a compression strain to the GaAs substrate.

Meanwhile, the AlGaInP-based material has a band gap in the range of 1.35 eV to 2.45 eV. The AlGaInP-based material compositionally varies in lattice constant ranging from smaller than to greater than GaAs forming the substrate. Therefore, the AlGaInP-based material may have a compression strain or a tensile strain to the GaAs.

Therefore, if an AlGaInP-based material whose composition has a tensile strain to GaAs is used as the AlGaInP layer, the compression strain of the AlGaInAs layer is compensated, which results in a buffer layer having almost no strain.

Therefore, in the first cavity emitting a red laser beam, the composition of the AlGaInAs-based material used as the AlGaInAs layer may be selected in such a range that the band gap is greater than 1.7 eV, and the composition of the AlGaInP-based material used as the AlGaInP layer may be selected in such a range that the band gap is greater than 1.7 eV and that the AlGaInP-based material has tensile strain. That is, the compositions may be selected in ranges respectively shown by hatching in FIG. 3A and FIG. 3B.

Moreover, in the second cavity emitting an infrared laser beam, the composition of the AlGaInAs-based material used as the AlGaInAs layer may be selected in such a range that the band gap is greater than 1.45 eV, and the composition of the AlGaInP-based material used as the AlGaInP layer may be selected in such a range that the band gap is greater than 1.45 eV and that the AlGaInP-based material has tensile strain. That is, the compositions may be selected in ranges respectively surrounded by chain double-dashed lines in FIG. 3A and FIG. 3B.

Specifically, assuming that a general formula is $Al_aGa_bIn_{1-a-b}As$, the composition of the AlGaInAs layer may fall in range satisfying $0<a<1$, $0<b<1$, and $b \leq -2.4a+1.32$ as shown in FIG. 3A. Assuming that a general formula is $Al_cGa_dIn_{1-c-d}P$, the composition of the AlGaInP layer may fall in range satisfying $0<c<1$, $0<d<1$, and $d \geq -c+0.53$ as shown in FIG. 3B.

To simplify processes, it is preferable that the first buffer layer 21 and the second buffer layer 31 have the same composition. Therefore, it is preferable to select a composition having a band gap greater than 1.7 eV for both the first buffer layer 21 and the second buffer layer 31. The AlGaInP-based material necessarily has a band gap greater than or equal to 1.7 eV in order to have the tensile strain. Also on this account, it is preferable to select the same composition for both the first buffer layer 21 and the second buffer layer 31.

In the present embodiment, the first buffer layer 21 of the first cavity emitting a red laser beam and the second buffer layer 31 of the second cavity emitting an infrared laser beam were formed by layers of $Al_{0.45}Ga_{0.40}In_{0.15}As$ and layers of $Al_{0.36}Ga_{0.18}In_{0.46}P$. As a result, for an operation of a pulse duration of 50 ns and of a pulse duty cycle of 40% performed at a temperature of 80° C., no kink appeared up to a light output of 400 mW in the first cavity emitting a red laser beam. The second cavity emitting an infrared laser beam had a very good linearity of a current versus light output characteristic and a kink level greater than or equal to 500 mW.

Figure 4A:
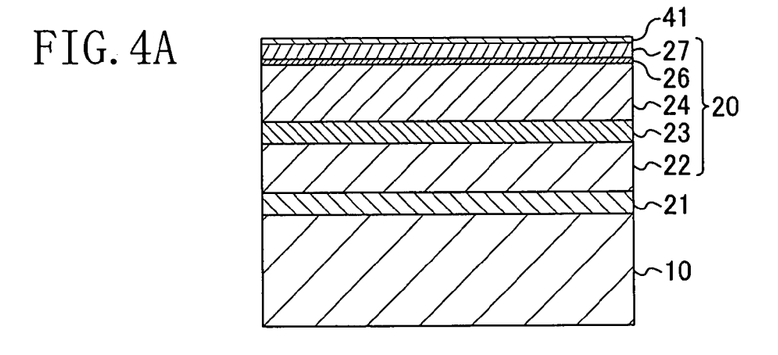
FIG. 4A through FIG. 4C are cross sectional views illustrating the method of fabricating the semiconductor laser device of an embodiment of the present invention in the order of steps.
Figure 4B:
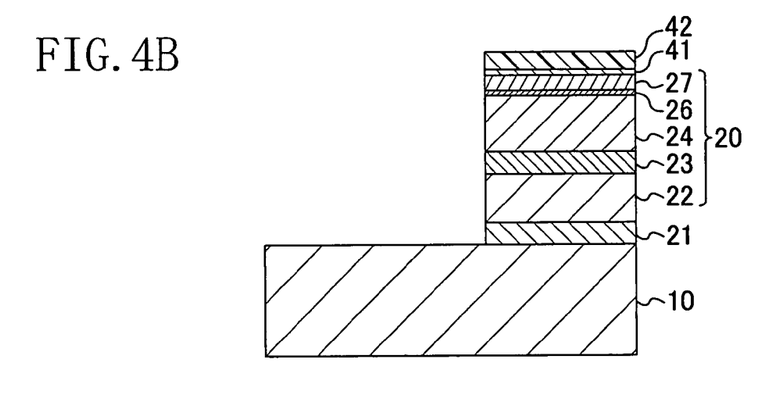
Figure 4C:
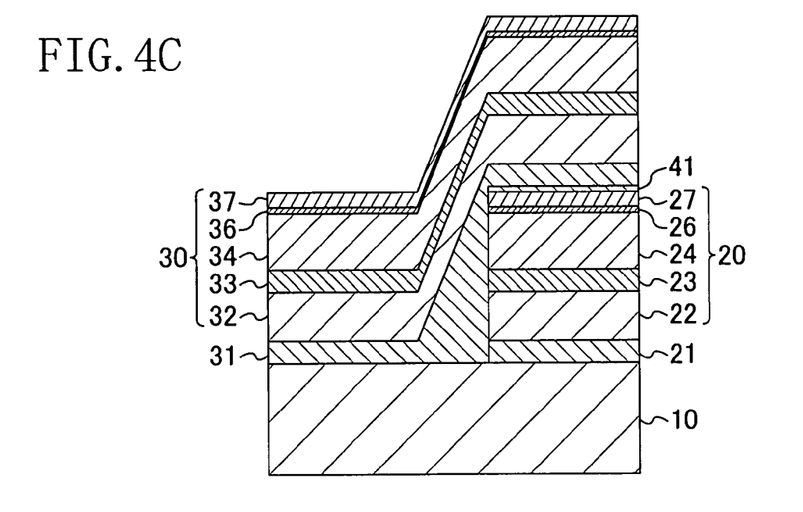

A method of fabricating the semiconductor laser device of the present embodiment will be described below with reference to the drawings. FIG. 4 illustrates the method of fabricating the semiconductor laser device of the present embodiment in the order of steps.

First, as illustrated with FIG. 4A, on a substrate 10 formed of n-type GaAs, a first buffer layer 21 is formed by alternately stacking n-type AlGaInAs layers and n-type AlGaInP layers several times by metal organic chemical vapor deposition (MOCVD). Subsequently, a first lower cladding layer 22 of n-type AlGaInP having a thickness of 2 μm, a first active layer 23, a first upper cladding layer 24 of p-type AlGaInP, a first protection layer 26 of p-type GaInP having a thickness of 50 nm, a first contact layer 27 of p-type GaAs having a thickness of 400 nm, and an interface layer 41 of p-type GaInP having a thickness of 50 nm are formed. For epitaxial growth of each of the layers, molecular beam epitaxy, for example, may be used instead of MOCVD.

To form the first active layer 23, a first lower guide layer of AlGaInP is formed, and then first well layers of GaInP and first barrier layers of AlGaInP are alternately stacked with a stacking cycle of 2.5, and then a first upper guide layer of AlGaInP is formed. In the present embodiment, the first active layer 23 has a strained quantum well structure. However, the first active layer 23 may have a non-strained quantum well structure, or a bulk structure. Although no description is given of a conductivity type of the active layer, the active layer may be p-type or n-type, or the active layer may be undoped.

Next, as illustrated with FIG. 4B, the substrate is put out of a MOCVD reactor, and then photolithography is performed to form a resist pattern 42. Using the pattern as a mask, an exposed portion is removed by a sulfuric acid-based or hydrochloric acid-based etching solution. In this way, a first semiconductor layer 20 is formed.

After the resist pattern 42 is removed, as illustrated with FIG. 4C, MOCVD is performed again to from a second buffer layer 31, a second lower cladding layer 32 of n-type AlGaInP, a second active layer 33, a second upper cladding layer 34 of p-type AlGaInP, a second protection layer 36 of p-type GaINP, and a second contact layer 37 of p-type GaAs.

To form the second active layer 33, a second lower guide layer of AlGaAs is formed, and then well layers of GaAs and barrier layers of AlGaAs are stacked with a stacking cycle of 2.5, and subsequently a second upper guide layer of AlGaAs is formed.

Figure 5A:
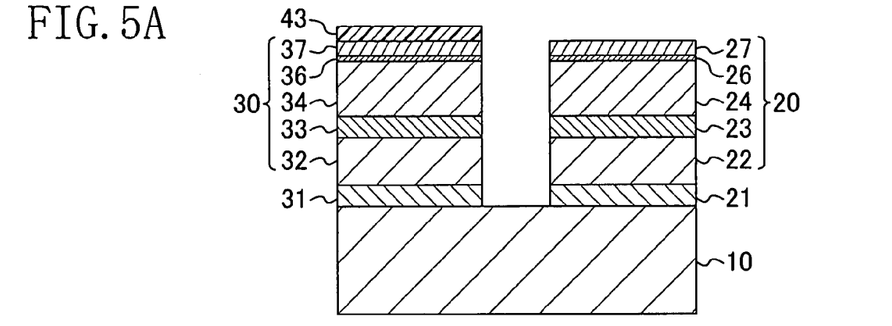
FIG. 5A through FIG. 5D are cross sectional views illustrating the method of fabricating the semiconductor laser device of the embodiment of the present invention in the order of steps.

Next, as illustrated with FIG. 5A, photolithography is performed to form a resist pattern 43. Using the pattern as a mask, an exposed portion is removed by a sulfuric acid-based or hydrochloric acid-based etching solution. In this way, the layers from the second buffer layer 31 up to the second contact layer 37 which are formed in the exposed portion are removed to form a second semiconductor layer 30. An upper surface of the first contact layer 27 is exposed on the first semiconductor layer 20.

Figure 5B:
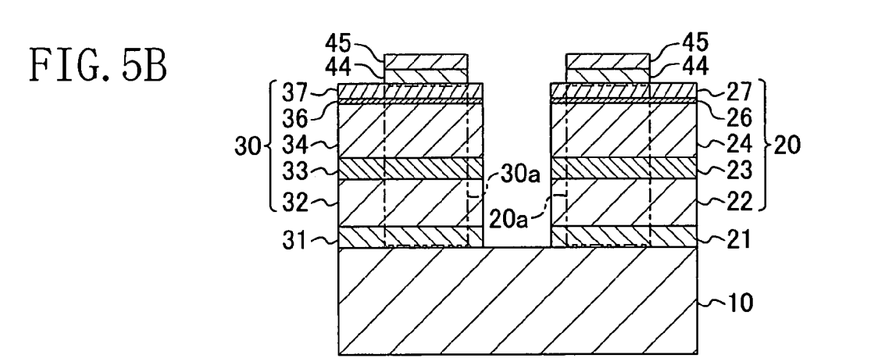

Next, the resist pattern 43 is removed. Then, on the first contact layer 27 and the second contact layer 37, an impurity diffusion source 44 formed of Zn and a cap film 45 are deposited by atmospheric pressure thermal CVD (370° C.) and patterned by lithography and dry etching to have a predetermined window length. Then, as illustrated with FIG. 5B, Zn is diffused by a thermal treatment for causing intermixing in the semiconductor layer to form a window structure 20a and a window structure 30a.

Next, the impurity diffusion source 44 and the cap film 45 are removed. Then, as illustrated with FIG. 5C, on the first contact layer 27 and the second contact layer 37, a silicon oxide ($SiO_2$) film having a thickness of 0.3 μm is deposited by atmospheric pressure thermal CVD (370° C.), and then patterned by lithography and dry etching to form stripe-patterned masks 46. Using the masks 46 as etching masks, part of the first contact layer 27, the first protection layer 26, and the first upper cladding layer 24 and part of the second contact layer 37, the second protection layer 36, and the second upper cladding layer 34 are selectively removed. In this way, mesa-shaped ridge stripe sections are formed for the first cavity 12 and the second cavity 13.

Figure 5C:
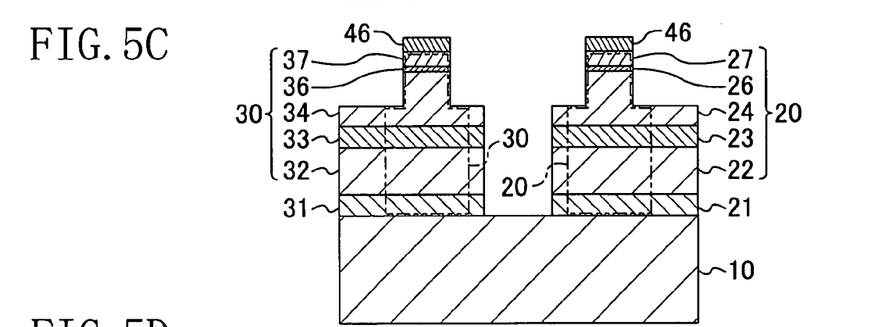

Next, an oxide silicon mask covering the ridge stripe sections is formed. Then, selective growth of current block layers 47 is performed by MOCVD. The current block layers 47 are formed of n-type AlInP and having a thickness of 700 nm.

Figure 5D:
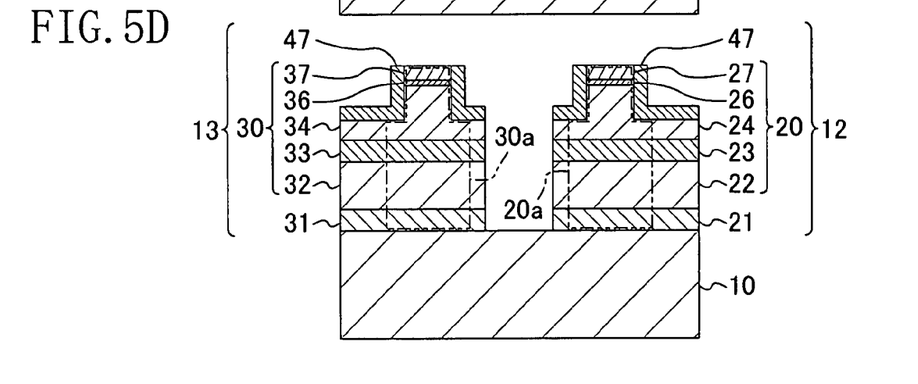

Next, as illustrated with FIG. 5D, the oxide silicon mask is removed by a hydrofluoric acid-based etching solution.

The current block layers may be formed by a dielectric film. In this case, after the formation of the ridge stripe sections, the dielectric film is formed on a whole surface of the substrate, and the dielectric film is etched by a hydrofluoric acid-based chemical solution such that upper surfaces of the first contact layer 27 and the second contact layer 37 are exposed. To differentiate the refractive index of the dielectric film from that of the cladding layer, the dielectric film may be a silicon nitride film (SiN), a silicon oxide film ($SiO_2$), a titanium oxide film ($TiO_2$), an aluminum oxide layer ($Al_2O_3$), a film of hydrogenated amorphous Si, or a multilayer film thereof.

In the method of fabricating the semiconductor laser device of the present embodiment, the window structure 20a of the first cavity 12 emitting a red laser beam and the window structure 30a of the second cavity 13 emitting an infrared laser beam are formed by the same thermal treatment. Therefore, it is possible to reduce steps and cost of fabricating components.

Although in the present invention, each of the first lower cladding layer 22 and the second lower cladding layer 32 has a carrier concentration of $5.3\times10^{17}$ cm$^{-3}$, the carrier concentration may be greater than or equal to about $1\times10^{17}$ cm$^{-3}$, preferably greater than or equal to about $3\times10^{17}$ cm$^{-3}$, and more preferably greater than or equal to about $5\times10^{17}$ cm$^{-3}$. In this way, a reduction in electron injection efficiency by the spike formation at a hetero-interface hardly occurs, and a good temperature characteristic can be obtained also in a high temperature environment of higher than or equal to 80° C.

In the present embodiment, the ridge stripe sections are formed after the window structures are formed. However, the window structures may be formed after the ridge stripe sections are formed.

In the present embodiment, the first buffer layer and the second buffer layer are formed by a layered structure of the AlGaInAs layers and the AlGaInP layers which are alternately stacked. However, in order to suppress an increase in leak current due to the window structures, the buffer layers may have a band gap greater than that of the active layers. Therefore, as long as no occurrence of crystal defects is found, an AlGaInAs layer or an AlGaInP layer may be used alone. Note that, in this case, it is necessary to adjust the temperature and the period of the diffusion of Zn such that the diffusion of Zn stops near an interface between the buffer layer and the lower cladding layer. Alternatively, to allow crystal growth while maintaining the lattice matching to the substrate, an $Al_xGa_yIn_{1-x-y}As_zP_{1-Z}$ (0<x<1, 0<y<1, 0<z<1, and x+y+z=1)-based material may be used.

The composition, the size, and the like of the semiconductor layer shown in the embodiment are mere examples and may be changed accordingly. Although an example of using the substrate of GaAs is shown, any substrate that allows the growth of the semiconductor layer to form the semiconductor laser device may be used. Although an example of the semiconductor laser device including the first cavity emitting a red laser beam and the second cavity emitting an infrared laser beam is shown, any first and second cavities may be used. More than two cavities may be formed over the substrate. Cavities emitting a laser bean of the same wavelength or a laser beam of the same range may be combined together.

As described above, the semiconductor laser device and the method of fabricating the same of the present invention allow realizing a semiconductor laser device including a plurality of cavities, wherein a leak current is not caused by impurity diffusion and reliability does not decreases in high power operation. The semiconductor laser device and the method of fabricating the same of the present invention are especially applicable to, for example, a multiwavelength semiconductor laser device used as a light source typically for an optical disc device or for other devices such as an electronic device and an information processor and to a method of fabricating the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor laser device comprising:
a first cavity and a second cavity formed apart from each other over a semiconductor substrate, wherein
the first cavity includes a first buffer layer and a first semiconductor layer on the first buffer layer, the first semiconductor layer including a first lower cladding layer, a first active layer, and a first upper cladding layer, and the first semiconductor layer being formed with a stripe structure,
the second cavity includes a second buffer layer and a second semiconductor layer on the second buffer layer, the second semiconductor layer including a second lower cladding layer, a second active layer, and a second upper cladding layer, and the second semiconductor layer being formed with a stripe structure,
a window structure is provided in a region near an end face of each of the first semiconductor layer and the second semiconductor layer, the window structure being formed by diffusing an impurity,
a band gap of the first buffer layer is greater than that of the first active layer,
a band gap of the second buffer layer is greater than that of the second active layer, and
each of the first buffer layer and the second buffer layer is a layered element formed by alternately stacked n-type AlGaInAs layers and n-type AlGaInP layers.

2. The semiconductor laser device of claim 1, wherein the semiconductor substrate is formed of GaAs, and
a layer of the layered element closest to the semiconductor substrate is one of the AlGaInAs layers.

3. The semiconductor laser device of claim 2, wherein the AlGaInAs layers are greater in lattice constant than the semiconductor substrate, and the AlGaInP layers are lower in lattice constant than the semiconductor substrate.

4. The semiconductor laser of claim 2, wherein
the first cavity and the second cavity are respectively a cavity for outputting a red laser beam or a cavity for outputting an infrared laser beam, and
each of the first buffer layer and the second buffer layer is formed of a compound represented by a general formula $Al_aGa_bIn_{1-a-b}As$ (where 0<a<1, 0 <b<1, b≦-2.4a+1.32, a+b≦1) and a compound represented by a general formula $Al_cGa_dIn_{1-c-d}P$ (where 0<c<1, 0<d<1, d≧-c +0.53, c+d≦1).

5. A semiconductor laser device comprising:
a first cavity and a second cavity formed apart from each other over a semiconductor substrate, wherein
the first cavity includes a first buffer layer and a first semiconductor layer on the first buffer layer, the first semiconductor layer including a first lower cladding layer, a first active layer, and a first upper cladding layer, and the first semiconductor layer being formed with a stripe structure, the second cavity includes a second buffer layer and a second semiconductor layer on the second buffer layer, the second semiconductor layer including a second lower cladding layer, a second active layer, and a second upper cladding layer, and the second semiconductor layer being formed with a stripe structure, a window structure is provided in a region near an end face of each of the first semiconductor layer and the second semiconductor layer, the window structure being formed by diffusing an impurity, a band gap of the first buffer layer is greater than that of the first active layer, a band gap of the second buffer layer is greater than that of the second active layer, and each of the first buffer layer and the second buffer layer is formed of a material represented by a general formula $Al_eGa_fIn_{1-e-f}As_gP_{1-g}$(where $0<e<1$, $0<f<1$, $e+f<1$, $0<g<1$).

6. The semiconductor laser device of claim 1, wherein the first active layer is formed of a material represented by a general formula $Al_gGa_hIn_{1-g-h}P$(where $0\leq g<1$, $0<h\leq 1$, $g+h<1$), and the second active layer is formed of a material represented by a general formula $Al_iGa_{1-i}As$(where $0+i<1$).

7. The semiconductor laser device of claim 5, wherein the first active layer is formed of a material represented by a general formula $Al_gGa_hIn_{1-g-h}P$(where $0\leq g<1, 0<h\leq 1$, $g+h<1$), and the second active layer is formed of a material represented by a general formula $Al_{iGa1-i}As$(where $0\leq i<1$).

* * * * *